(12) United States Patent
Abu-Surra

(10) Patent No.: US 8,327,216 B2
(45) Date of Patent: Dec. 4, 2012

(54) SINGLE-STAGE DECODER FOR RAPTOR CODES

(75) Inventor: Shadi Abu-Surra, Tucson, AZ (US)

(73) Assignee: Samsung Electronics Co., Ltd., Suwon-si (KR)

( * ) Notice: Subject to any disclaimer, the term of this patent is extended or adjusted under 35 U.S.C. 154(b) by 838 days.

(21) Appl. No.: 12/384,519

(22) Filed: Apr. 6, 2009

(65) Prior Publication Data

US 2010/0100792 A1    Apr. 22, 2010

Related U.S. Application Data

(60) Provisional application No. 61/196,926, filed on Oct. 22, 2008.

(51) Int. Cl.
*H03M 13/00* (2006.01)
(52) U.S. Cl. ...................................... 714/752
(58) Field of Classification Search .......... 714/748–753, 714/755, 761, 781, 791, 795
See application file for complete search history.

(56) References Cited

U.S. PATENT DOCUMENTS

| | | | |
|---|---|---|---|
| 7,877,061 B2 * | 1/2011 | Klein et al. ................. | 455/63.1 |
| 8,036,145 B2 * | 10/2011 | Power et al. ................. | 370/280 |
| 2006/0279437 A1 | 12/2006 | Luby et al. | |
| 2009/0055705 A1 * | 2/2009 | Gao ............................ | 714/755 |
| 2011/0002320 A1 * | 1/2011 | Yuk et al. ................... | 370/338 |
| 2011/0051848 A1 * | 3/2011 | Yuk et al. ................... | 375/316 |

FOREIGN PATENT DOCUMENTS

| | | |
|---|---|---|
| CN | 101286819 A | 10/2008 |
| KR | 1020080013989 A | 2/2008 |
| WO | WO 2006/117390 A1 | 11/2006 |
| WO | WO 2007/092214 A1 | 8/2007 |

OTHER PUBLICATIONS

Amin Shokrollahi, "Raptor Codes", IEEE Transactions on Information Theory, vol. 52, No. 6, Jun. 2006, p. 2551-2567.
Saejoon Kim, et al., "An Efficient Algorithm for ML Decoding of Raptor Codes over the Binary Erasure Channel", IEEE Communications Letters, vol. 12, No. 8, Aug. 2008, p. 578-580.
Michael Ludy, et al., "Raptor Codes for Reliable Download Delivery in Wireless Broadcast Systems", 2006 IEEE, p. 192-197.
P. Palanisamy, et al., "Performance Analysis of Raptor Codes in OFDM Systems", First International Conference on Emerging Trends in Engineering and Technology, 2008 IEEE, p. 1307-1312.
Extended European Search Report dated Oct. 5, 2012, in connection with European Patent Application No. 09822138.5, 11 pages.
Paolini, et al.; "Low Complexity LDPC Codes with Near-Optimum Performance over the BEC"; XP 031393767 IEEE, Aug. 26, 2008; pp. 274-282.
Heo, et al.; "Efficient Decoding Algorithm for Raptor Codes for Multimedia Broadcast Services"; XP 031297485 IEEE, Jan. 9, 2008; 2 pages.
Saejoon, et al.; "Incremental Gaussian Elimination Decoding of Raptor Codes over BEC"; XP011226294 IEEE, Apr. 1, 2008; 3 pages.

* cited by examiner

*Primary Examiner* — Nadeem Iqbal

(57) ABSTRACT

A system and method for recovering erased symbols in a wireless communication is provided. The system and method includes a receiver configured to receive encoded data transmissions. The receiver includes a single stage decoder configured to perform a decoding operation. The single stage decoder also is configured to determine a symbol erasure rate, the symbol erasure rate defined by a number of erased symbols. The single stage decoder further is configured to generate a recovery matrix based on the symbol erasure rate and invert the recovery matrix. Thereafter, the single stage decoder recovers the erased symbols based on a function of the inverted recovery matrix.

20 Claims, 4 Drawing Sheets

SINGLE-STAGE DECODER FOR RAPTOR CODES

CROSS-REFERENCE TO RELATED APPLICATION(S) AND CLAIM OF PRIORITY

The present application is related to U.S. Provisional Patent No. 61/196,926, filed Oct. 22, 2008, entitled "SINGLE-STAGE DECODER FOR RAPTOR CODES". Provisional Patent No. 61/196,926 is assigned to the assignee of the present application and is hereby incorporated by reference into the present application as if fully set forth herein. The present application hereby claims priority under 35 U.S.C. §119(e) to U.S. Provisional Patent No. 61/196,926.

TECHNICAL FIELD OF THE INVENTION

The present application relates generally to decoding wireless transmission and, more specifically, to a decoder configured to vary a complexity based on a packet erasure rate.

BACKGROUND OF THE INVENTION

Traditional raptor decoders, such as described in 3GPP TS 26.346: "Multimedia Broadcast/Multicast Service (MBMS); Protocols and codecs", version 7.8.0, are two stage decoders. The disadvantage of such a staged process appears when the system packet erasure rate is low (i.e., number of erased source symbols is small). Even if only one source symbol is erased during the transmission, the decoder still needs to compute all the intermediate symbols to recover the erased source symbol. Moreover the computational complexity of this staged decoder is dominated by the computational complexity needed to compute the intermediate symbols. Consequently, the computational complexity of the staged decoder does not depend on the packet erasure rate.

These traditional decoders work fine when the erasure rate is high. However, in a typical wireless communication link that is protected by a turbo code at the physical layer, the packet erasure rate is approximately one percent (1%). In such a low erasure rate scenario, the computation complexity needed to recover the 1% of the source symbols is approximately the same as that needed to recover all of the source symbols. Accordingly, the efficiency of such a decoder, when need to recover in a system with a low erasure rate, is low.

Therefore, there is a need in the art for an improved decoder. In particular, there is a need for an improved decoder that is capable of efficiently recovering source symbols in systems with a low erasure rate.

SUMMARY OF THE INVENTION

A wireless communications device capable of decoding encoded transmissions in a wireless communications network is provided. The wireless communications device includes a single stage decoder. The single stage decoder includes programmable finite state machine. The programmable finite state machine is capable of executing a plurality of instructions associated with the single stage decoder. The single stage decoder is configured to recover erased symbols based, in part, on inverting a recovery matrix. The size of the recovery matrix is based on a symbol erasure rate.

A decoder, for use in a wireless communications device, capable of decoding raptor-encoded transmissions in a wireless communications network is provided. The decoder includes a single stage for recovering erased symbols and a processor. The processor is capable of executing a plurality of instructions associated with the single stage. The single stage is configured to recover erased symbols based, in part, on inverting a recovery matrix. The size of the recovery matrix is based on a symbol erasure rate.

A method for recovering erased symbols in a transmission in a wireless communications network is provided. The method includes receiving a data transmission. The method also includes performing a decoding operation with a single stage decoder and determining a symbol erasure rate, the symbol erasure rate defined by a number of erased symbols. Further, the method includes generating a recovery matrix based on the symbol erasure rate and inverting the recovery matrix. The method further includes recovering erased symbols based on a function of the inverted recovery matrix.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

FIGS. 1 through 6, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged wireless communication system.

Figure 1:
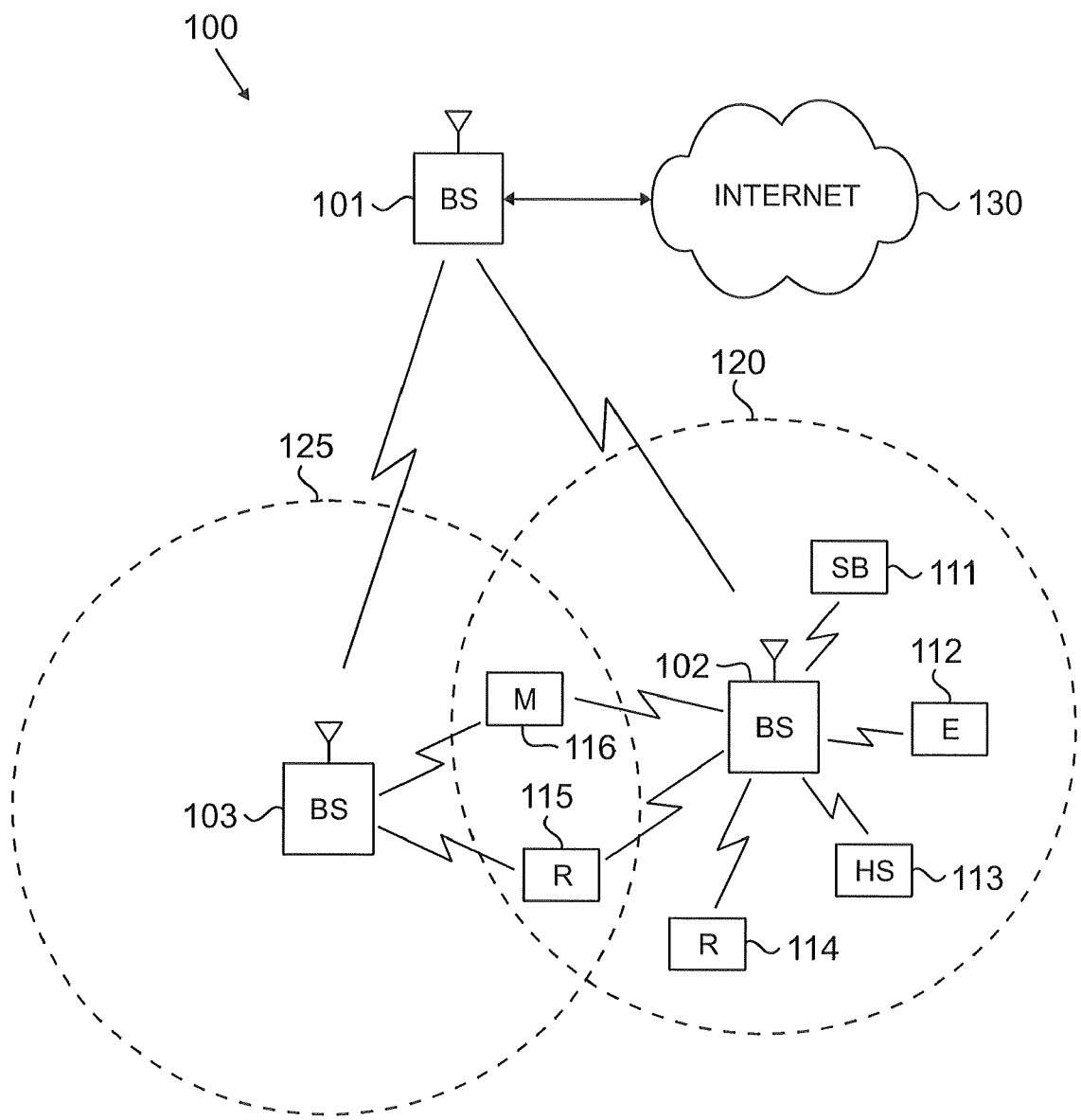
FIG. 1 illustrates an exemplary wireless network 100, which transmits ACK/NACK messages according to an exemplary embodiment of the disclosure.

FIG. 1 illustrates an exemplary wireless network 100, which transmits ACK/NACK messages according to the principles of the present disclosure. In the illustrated embodiment, wireless network 100 includes base station (BS) 101, base station (BS) 102, base station (BS) 103, and other similar base stations (not shown). Base station 101 is in communication with base station 102 and base station 103. Base station 101 is also in communication with Internet 130 or a similar IP-based network (not shown).

Base station 102 provides wireless broadband access (via base station 101) to Internet 130 to a first plurality of subscriber stations within coverage area 120 of base station 102. The first plurality of subscriber stations includes subscriber station 111, which may be located in a small business (SB), subscriber station 112, which may be located in an enterprise (E), subscriber station 113, which may be located in a WiFi hotspot (HS), subscriber station 114, which may be located in a first residence (R), subscriber station 115, which may be located in a second residence (R), and subscriber station 116, which may be a mobile device (M), such as a cell phone, a wireless laptop, a wireless PDA, or the like.

Base station 103 provides wireless broadband access (via base station 101) to Internet 130 to a second plurality of subscriber stations within coverage area 125 of base station 103. The second plurality of subscriber stations includes subscriber station 115 and subscriber station 116. In an exemplary embodiment, base stations 101-103 may communicate with each other and with subscriber stations 111-116 using OFDM or OFDMA techniques.

Base station 101 may be in communication with either a greater number or a lesser number of base stations. Furthermore, while only six subscriber stations are depicted in FIG. 1, it is understood that wireless network 100 may provide wireless broadband access to additional subscriber stations. It is noted that subscriber station 115 and subscriber station 116 are located on the edges of both coverage area 120 and coverage area 125. Subscriber station 115 and subscriber station 116 each communicate with both base station 102 and base station 103 and may be said to be operating in handoff mode, as known to those of skill in the art.

Subscriber stations 111-116 may access voice, data, video, video conferencing, and/or other broadband services via Internet 130. In an exemplary embodiment, one or more of subscriber stations 111-116 may be associated with an access point (AP) of a WiFi WLAN. Subscriber station 116 may be any of a number of mobile devices, including a wireless-enabled laptop computer, personal data assistant, notebook, handheld device, or other wireless-enabled device. Subscriber stations 114 and 115 may be, for example, a wireless-enabled personal computer (PC), a laptop computer, a gateway, or another device.

Figure 2A:
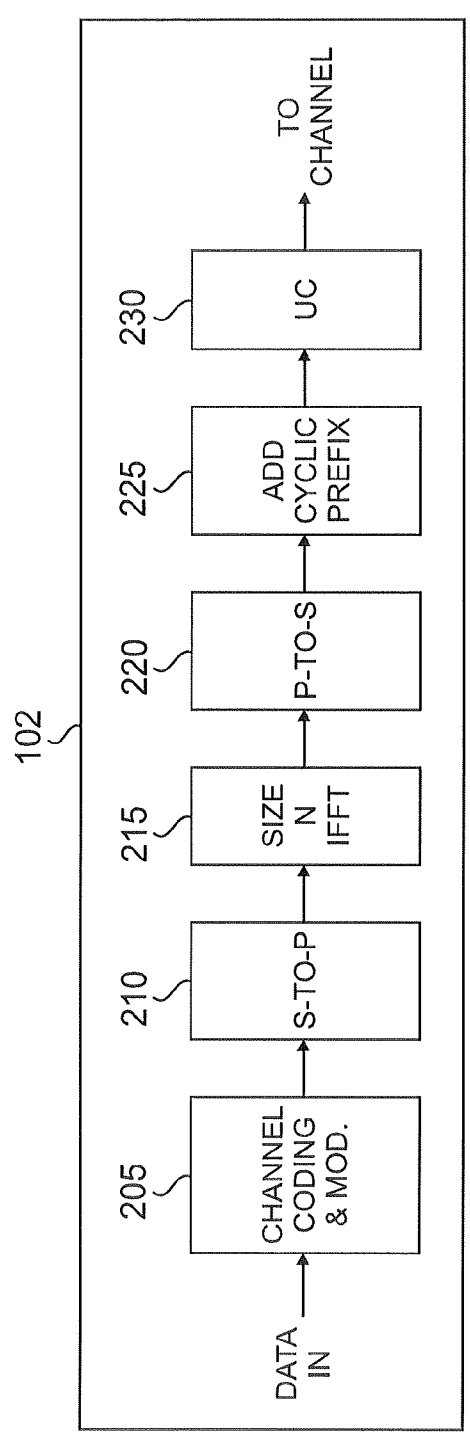
FIG. 2A illustrates a high-level diagram of an orthogonal frequency division multiple access transmit path according to an exemplary embodiment of the disclosure.
Figure 2B:
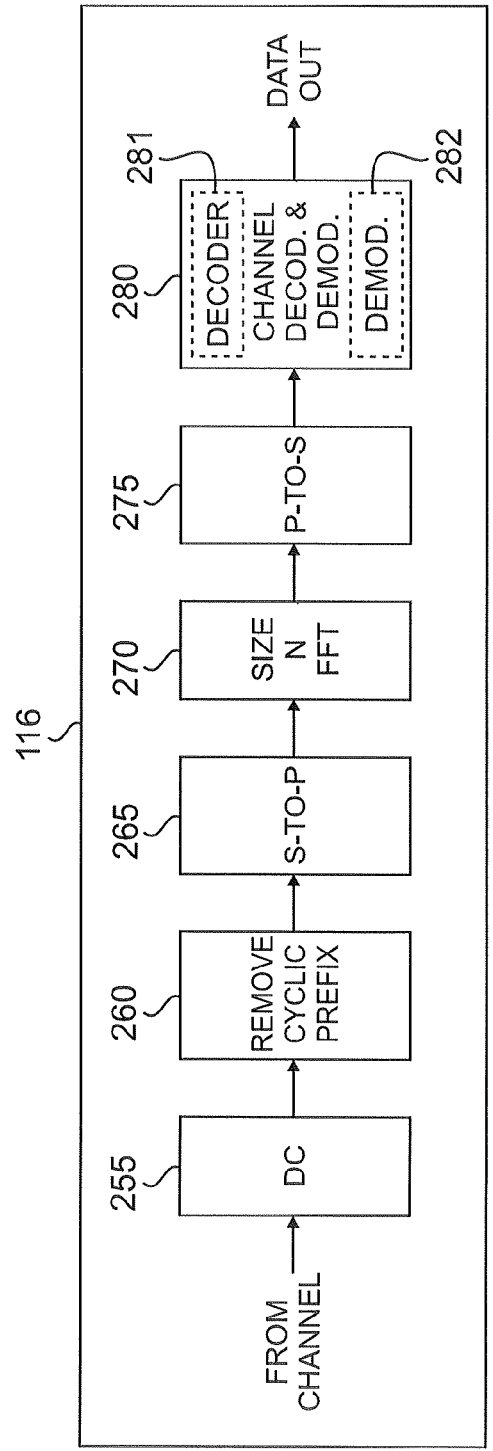
FIG. 2B illustrates a high-level diagram of an orthogonal frequency division multiple access receive path according to an exemplary embodiment of the disclosure.

FIG. 2A is a high-level diagram of an orthogonal frequency division multiple access (OFDMA) transmit path. FIG. 2B is a high-level diagram of an orthogonal frequency division multiple access (OFDMA) receive path. In FIGS. 2A and 2B, the OFDMA transmit path is implemented in base station (BS) 102 and the OFDMA receive path is implemented in subscriber station (SS) 116 for the purposes of illustration and explanation only. However, it will be understood by those skilled in the art that the OFDMA receive path may also be implemented in BS 102 and the OFDMA transmit path may be implemented in SS 116.

The transmit path in BS 102 comprises channel coding and modulation block 205, serial-to-parallel (S-to-P) block 210, Size N Inverse Fast Fourier Transform (IFFT) block 215, parallel-to-serial (P-to-S) block 220, add cyclic prefix block 225, up-converter (UC) 230. The receive path in SS 116 comprises down-converter (DC) 255, remove cyclic prefix block 260, serial-to-parallel (S-to-P) block 265, Size N Fast Fourier Transform (FFT) block 270, parallel-to-serial (P-to-S) block 275, channel decoding and demodulation block 280.

In some embodiments, channel decoding and demodulation block 280 can be a single component configured to perform decoding and demodulation. In some embodiments, channel decoding and demodulation block 280 comprises a decoder 281 and a demodulator 282. In such embodiments, the decoder can include one or more blocks for decoding operations. Additionally, the demodulator can include one or more blocks for demodulation operations. In some such embodiments, the decoder 281 includes a processor (e.g., a controller or finite state machine) and a plurality of instructions stored in a memory (not illustrated) configured to cause the decoder 281 to perform a number of calculations for a decoding operation.

At least some of the components in FIGS. 2A and 2B may be implemented in software while other components may be implemented by configurable hardware or a mixture of software and configurable hardware. In particular, it is noted that the FFT blocks and the IFFT blocks described in this disclosure document may be implemented as configurable software algorithms, where the value of Size N may be modified according to the implementation.

Furthermore, although this disclosure is directed to an embodiment that implements the Fast Fourier Transform and the Inverse Fast Fourier Transform, this is by way of illustration only and should not be construed to limit the scope of the disclosure. It will be appreciated that in an alternate embodiment of the disclosure, the Fast Fourier Transform functions and the Inverse Fast Fourier Transform functions may easily be replaced by Discrete Fourier Transform (DFT) functions and Inverse Discrete Fourier Transform (IDFT) functions, respectively. It will be appreciated that for DFT and IDFT functions, the value of the N variable may be any integer number (i.e., 1, 2, 3, 4, etc.), while for FFT and IFFT functions, the value of the N variable may be any integer number that is a power of two (i.e., 1, 2, 4, 8, 16, etc.).

In BS 102, channel coding and modulation block 205 receives a set of information bits, applies coding (e.g., Turbo coding) and modulates (e.g., QPSK, QAM) the input bits to produce a sequence of frequency-domain modulation symbols. Serial-to-parallel block 210 converts (i.e., de-multiplexes) the serial modulated symbols to parallel data to produce N parallel symbol streams where N is the IFFT/FFT size used in BS 102 and SS 116. Size N IFFT block 215 then performs an IFFT operation on the N parallel symbol streams to produce time-domain output signals. Parallel-to-serial block 220 converts (i.e., multiplexes) the parallel time-domain output symbols from Size N IFFT block 215 to produce a serial time-domain signal. Add cyclic prefix block 225 then inserts a cyclic prefix to the time-domain signal. Finally, up-converter 230 modulates (i.e., up-converts) the output of add cyclic prefix block 225 to RF frequency for transmission via a wireless channel. The signal may also be filtered at baseband before conversion to RF frequency.

The transmitted RF signal arrives at SS 116 after passing through the wireless channel and reverse operations to those at BS 102 are performed. Down-converter 255 down-converts the received signal to baseband frequency and remove cyclic prefix block 260 removes the cyclic prefix to produce the serial time-domain baseband signal. Serial-to-parallel block 265 converts the time-domain baseband signal to parallel time domain signals. Size N FFT block 270 then performs an FFT algorithm to produce N parallel frequency-domain signals. Parallel-to-serial block 275 converts the parallel frequency-domain signals to a sequence of modulated data symbols. Channel decoding and demodulation block 280 demodulates and then decodes the modulated symbols to recover the original input data stream.

Each of base stations 101-103 may implement a transmit path that is analogous to transmitting in the downlink to subscriber stations 111-116 and may implement a receive path that is analogous to receiving in the uplink from subscriber stations 111-116. Similarly, each one of subscriber stations 111-116 may implement a transmit path corresponding to the architecture for transmitting in the uplink to base stations 101-103 and may implement a receive path corresponding to the architecture for receiving in the downlink from base stations 101-103.

The great demand for a reliable video transmission over wireless mobile networks has resulted in with vast challenges to engineers. Usually, video-media requires high transmission rate with delay constraints. Moreover, the media is transmitted over broadcast channel as in streaming mobile-TV channels, or over multicast channel as in transferring videos encapsulated in large file for large number of users. The nature of these channels in addition to the delay constraints excludes the option of having a feedback channel to acknowledge the transmission success.

Forward Error Control (FEC) schemes are suitable candidates in these scenarios. As a matter of fact FEC can be used in communications over any channel. In mobile technology, turbo code FEC scheme is adopted to achieve reliable communication. For example in the 3GPP standard, turbo code is part of the network's physical layer and has a fixed rate ranges between "⅓" and "1". This code achieves a bit error rate (BER) between $10^{-5}$ and $10^{-4}$. However, the achievable packet loss rate using a turbo code FEC scheme is about "0.01". As replacing this code is cost ineffective, an outer FEC scheme is an attractive solution, in particular, a family of FEC schemes called fountain codes is the most suitable candidate. Fountain codes are referenced in 3GPP TS 36.212: "Evolved Universal Terrestrial Radio Access (E-UTRA); Multiplexing and channel coding"; and J. Byers, M. Luby, M. Mitzenmacher, and A. Rege, "A digital fountain approach to reliable distribution of bulk data," ACM SIGCOMM Computer Communication Review, Volume 28, Issue 4, October 1998, the contents of which are hereby incorporated by reference into the present application as if fully set forth herein.

Fountain codes, are codes with the following properties: 1) Rateless codes that can generate infinite number of encoded symbols (as referenced herein, a symbol is usually a packet) from the original data; 2) Introduce no overhead such that the receiver can reconstruct a k-symbols message once any k encoding symbols have been received; and 3) Simple such that encoding/decoding can be very fast, preferably linear in time. Approximate realizations of such codes are Reed-Solomon codes, Luby transform (LT) codes, and Raptor codes. LT codes are described in M. Luby, M. Mitzenmacher, A. Shokrollahi, and D. Spielman, "Efficient erasure correcting codes," IEEE Trans. Inf. Theory. pp. 569-584, February 2001, the contents of which is hereby incorporated by reference into the present application as if fully set forth herein. Raptor codes are described in M. Luby, "LT codes," Proc. 43rd Ann. Symp. on Foundations in Computer Science, Vancouver, BC, Canada, pp. 271-280, November 2002, the contents of which is hereby incorporated by reference into the present application as if fully set forth herein. Raptor codes are the best overall approximation of fountain code.

Raptor code is being adopted in many broadcasting systems. Currently, Digital Video Broadcasting (DVB) includes an application layer FEC (Raptor code) in Digital Video Broadcasting-Handheld (DVB-H) referenced in A. Shokrollahi, "Raptor codes," IEEE Trans. Inf. Theory, pp. 2551-2567, June 2006; and also for Internet Protocol Television (IPTV) delivery referenced in ETSI TS 102 472: "Digital Video Broadcasting (DVB); IP Datacast over DVB-H: Content. Delivery Protocols"; the contents of each are hereby incorporated by reference into the present application as if fully set forth herein. Also, 3rd Generation Partnership Project (3GPP) Multimedia Broadcast Multicast Service (MBMS) incorporates the Raptor code in multicast file delivery services and video streaming as referenced in FG IPTV-C-0777: "DVB-IPI Application Layer FEC for ITU-T FG IPTV Application Layer FEC" the contents of which is hereby incorporated by reference into the present application as if fully set forth herein. The 3GPP MBMS raptor codes have been adopted in Internet Engineering Task Force (IETF) as referenced in 3GPP TS 26.346: "Multimedia Broadcast/Multicast Service (MBMS); Protocols and codecs", version 7.8.0 the contents of which is hereby incorporated by reference into the present application as if fully set forth herein.

All standards mentioned above are using the same raptor code. As such, an alternative Raptor code decoder is proposed that is faster than the existing decoder in scenarios where the packet erasure-rate is low.

Figure 3:
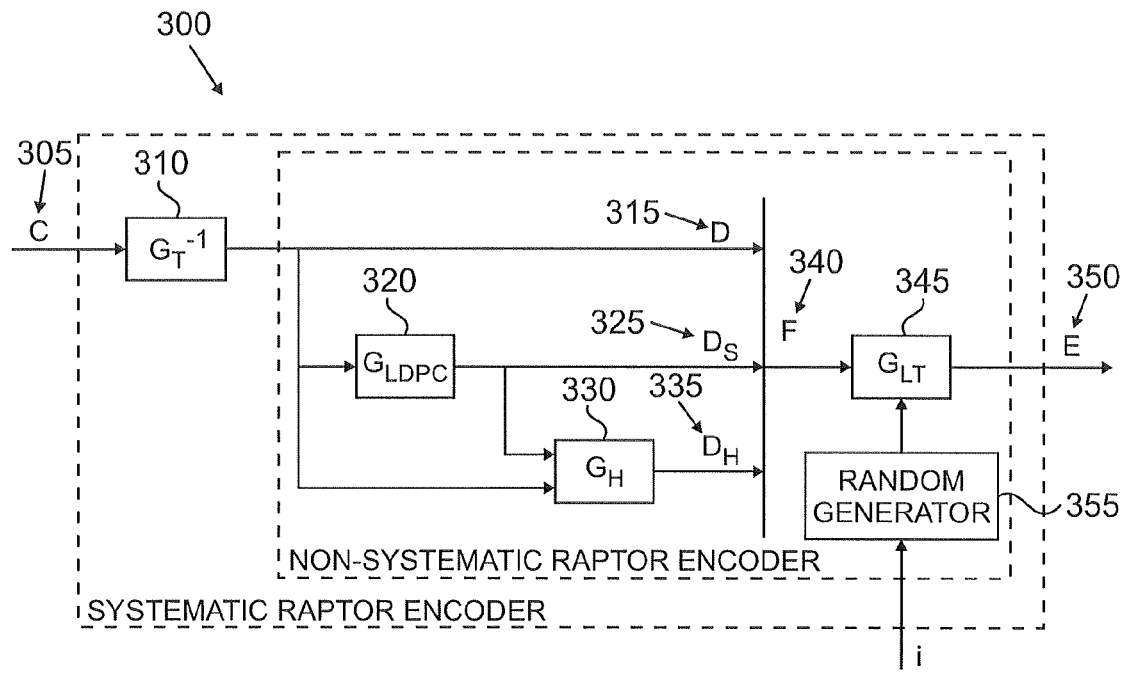
FIG. 3 illustrates an exemplary block diagram of a 3GPP MBMS raptor code according to embodiments of the disclosure

FIG. 3 illustrates an exemplary block diagram of a 3GPP MEMS raptor code according to embodiments of the present disclosure. The embodiment of the 3GPP MBMS raptor code 300 shown in FIG. 3 is for illustration only. Other embodiments of the 3GPP MEMS raptor code 300 could be used without departing from the scope of this disclosure.

Raptor code is a promising fountain code for its reliability and simplicity. In general, raptor code can be viewed as a concatenation of several linear codes, where the most-inner code is an LT code. This code is formed by the concatenation of stages included in two primary stages.

In a first stage, the source symbols C 305 enter a precoding stage 310 to ensure that the overall raptor code is systematic. The outputs of the precoder 310 are k precoded symbols D 315. Thereafter, the precoded symbols 315 are encoded using a systematic Low Density Parity Check (LDPC) code 320, which introduces s parity symbols $D_S$ 325. Then, the D 315 symbols and $D_S$ 325 symbols are encoded using a Half-code 330 (i.e., a systematic High Density Parity Check (HDPC) code) to add another h parity symbols $D_H$ 335. Therefore, precoded symbols D 315, the parities $D_S$ 325 generated from the LDPC 320, and parities $D_H$ 335 generated from the HDPC 330 are obtained. These symbols D 315, $D_S$ 325 and $D_H$ 335 are combined to produce symbols at an output of the first stage. The symbols at the output of this first stage are referenced as intermediate symbols F 340.

For example, k can be the number of source symbols. Then C 305 is a k×1 vector and D is given by Equation 1:

$$D = G_T^{-1} \cdot C. \quad \text{[Eqn. 1]}$$

The LDPC 320 and HDPC 330 stages are defined by Equations 2 and 3:

$$D_S = G_{LDPC} D. \quad \text{[Eqn. 2]}$$

$$D_H = G_{H'} \cdot [D^T | D_S^T]^T. \quad \text{[Eqn. 3]}$$

Note that the LDPC 320 and the HDPC 330 generator matrices are $[I_k | G_{LDPC}^T]^T$ and $[I_{k+s} | G_H^T]^T$ respectively. The LDPC 320 and the HDPC 330 generator matrices have the rates k/(k+s) and (k+s)/(k+s+h), respectively. Then, the intermediate symbols 340 are given by Equation 4:

$$F=[D^T|D_S^T|D_H^T]^T. \quad \text{[Eqn. 4]}$$

Intermediate symbol F 340 is an L×1 vector, where L=k+s+h.

In the last stage (e.g., also the second primary stage), an LT code 345 is applied to the intermediate symbols F 340. The output encoding symbols E 350 are produced as a result of encoding F 340 using the LT code 345. The output of the LT code 345 is given by Equation 5:

$$E=G_{LT}F. \quad \text{[Eqn. 5]}$$

LT codes 345 are also fountain codes. However, good LT codes 345 alone, without the outer codes of the raptor codes 300, require high computational complexity. As part of raptor codes 300, the LT codes encoding process 345 to generate an encoding symbol in E 350, referenced herein as $e_i$, is as follows.

First, choose a degree $d_i$ of the encoding symbol from a predetermined distribution. Then, choose uniformly at random $d_i$ of the symbols at the input of the LT code 345 (e.g., the intermediate symbols F 340). Finally, the encoding symbol $e_i$ is the component-wise exclusive-or of the $d_i$ chosen symbols. Note that the decoder 281 needs to know the set of intermediate symbols indices that are used in the encoding of each encoding symbol $e_i$. Since it is not desirable to transmit this information to the decoder 281, in order to obtain the pre-mentioned random choices, the 3GPP raptor code uses common random generators 355 at both the encoder 205 and the decoder 281. The common random generators 355 can be seeded by the index i of the encoded symbol $e_i$. This index is encoded in the packet ID for the packet carrying this symbol.

Raptor codes can be decoded iteratively using a Belief Propagation (BP) algorithm. However, in some embodiments a maximum likelihood (ML) decoder is used. The ML decoding process for this code consists of two stages. In a first stage, the intermediate symbols F 340 are decoded from the received encoding symbols E 350. In a second stage, the source symbols C 305 are computed from the intermediate symbols F 340.

The rows of the matrix $G_{LT}$ depend on the involved encoding symbols indices. For example, to alleviate any ambiguity while describing the 3GPP raptor decoder, the notation $G_{LT}(i_1, i_2, \ldots, i_n)$ 345 is used to refer to the matrix $G_{LT}$ 345 whose rows depend on the encoding symbols $e_{i1}, e_{i2}, e_{in}$. Also, $E(i_1, i_2, \ldots, i_n)$ 350 is used to refer to the vector of the received encoding symbols $e_{i1}, e_{i2}, \ldots, e_{in}$.

Figure 4:
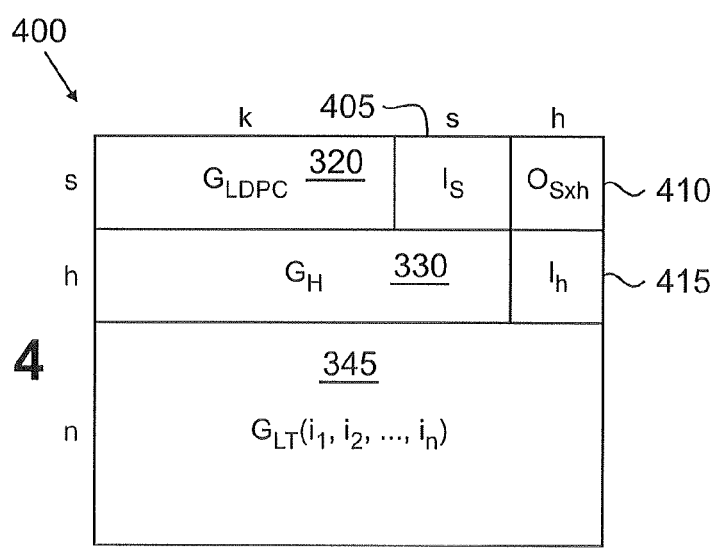
FIG. 4 illustrates an exemplary layout of a generating matrix for the 3GPP raptor code according to embodiments of the disclosure.

FIG. 4 illustrates an exemplary layout of a generating matrix for the 3GPP raptor code according to embodiments of the present disclosure. The embodiment of the generating matrix 400 shown in FIG. 4 is for illustration only. Other embodiments of the generating matrix 400 could be used without departing from the scope of this disclosure.

The generating matrix 400 includes the LDPC matrix 320, a first identity matrix 405, a zero matrix 410, the HDPC matrix 330, a second identity matrix 415 and the LT matrix 345.

The decoder 281 in the first stage of the ML decoding process uses the generating matrix $A(i_1, i_2, \ldots, i_n)$ 400 to compute the intermediate symbols according to Equation 6:

$$A(i_1, i_2, \ldots, i_r) \cdot F = \begin{bmatrix} 0_{s+h\times 1} \\ E(i_1, i_2, \ldots, i_r) \end{bmatrix}. \quad \text{[Eqn. 6]}$$

Equation 6 has a unique solution F 340 if and only if $A(i_1, i_2, \ldots, i_n)$ has rank equal to L. This implies that r≧k is a necessary condition for decoding success. In other words, the decoder 281 needs at least k encoding symbols to decode. The decoder 281 uses a Gaussian elimination algorithm designed for sparse matrices to invert the matrix $A(i_1, \ldots, i_2, \ldots, i_r)$ as illustrated by Equation 7:

$$F = A(i_1, i_2, \ldots, i_r)^{-1} \cdot \begin{bmatrix} 0_{s+h\times 1} \\ E(i_1, i_2, \ldots, i_r) \end{bmatrix}. \quad \text{[Eqn. 7]}$$

Once F 340 is computed, the second stage of the ML decoding process is straightforward. Since the over-all raptor code is systematic, this means the relationship between the source symbols C 305 and the intermediate symbols F 340 is defined by Equations 8:

$$A(1, 2, \ldots, k) \cdot F = \begin{bmatrix} 0_{s+h\times 1} \\ C \end{bmatrix}. \quad \text{[Eqn. 8]}$$

Equation 8 can be re-written as Equation 9:

$$G_{LT}(1, 2, \ldots, k) \cdot F = C. \quad \text{[Eqn. 9]}$$

Therefore, the decoder 281 needs to compute the intermediate symbol F 340 and the inverse of the generating matrix 400 (e.g., $A^{-1}$). Therefore, when the system packet erasure rate is low (i.e., number of erased source symbols is small), even if only one source symbol is erased during the transmission, the pre-described decoder still needs to compute all the intermediate symbols F 340 to recover the erased source symbol. Moreover the computational complexity of this staged decoder is dominated by the computations in the first stage. Consequently, the computational complexity of the staged decoder does not depend on the packet erasure rate. In a low erasure rate scenario, the computation complexity needed to recover 1% of the source symbols is approximately the same as that needed to recover all of the source symbols.

Figure 5:
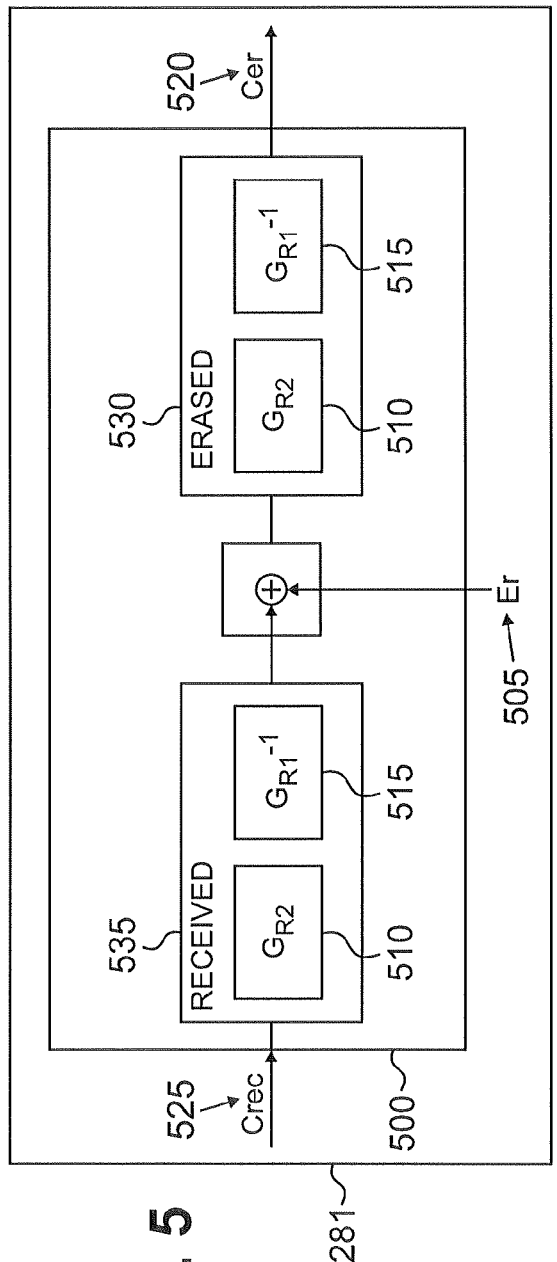
FIG. 5 illustrates a single stage decoder according to embodiments of the disclosure.

FIG. 5 illustrates a single stage decoder according to embodiments of the present disclosure. The single stage decoder 500 shown in FIG. 5 is for illustration only. Other embodiments of the single stage decoder 500 could be used without departing from the scope of this disclosure. Further, although a single stage raptor decoder 500 is illustrated, the descriptions herein apply equally to a single stage raptor encoder.

In some embodiments, the decoder 281 comprises a single stage raptor decoder 500. In a typical wireless link that is protected by a turbo code at the physical layer, the packet erasure rate is about one percent (1%). In the low erasure rate scenario, the computation complexity needed to recover 1% of the source symbols is proportional to the number of symbols to be recovered.

In additional and alternative embodiments, the single stage raptor decoder 500 is implemented in hardware, firmware or software, or some combination of at least two of the same. In some embodiments, the single stage raptor decoder 500 is implemented in layers above the physical layer (e.g., at a higher layer). For example, the single stage raptor decoder 500 can be in the application layer for 3GPP MBMS systems and in the convergence layer for IEEE 802.16 systems. In some embodiments, the single stage raptor decoder 500 is included as part of a turbo decoder to reduce the packet loss rate in the system.

The single stage decoder 500 is configured to recover symbols based on the amount of erased symbols. It will be understood that a symbol is a codeword in embodiments wherein the single stage raptor decoder 500 is in the physical layer, a MAC packet in embodiments wherein the single stage raptor decoder 500 is in the convergence layer, an IP packet in embodiments wherein the single stage raptor decoder 500 is in the application layer, and so forth. The derivation is starts with Equations 1-3, illustrated above. $G_H$, from Equation 3, can be re-written as illustrated by Equation 10:

$$G_H = [G_{H1} | G_{H2}]. \quad [\text{Eqn. 10}]$$

In Equation 10, $G_{H1}$ is an h×k matrix formed from the first k columns of $G_H$, and $G_{H2}$ is an h×s matrix formed from the remaining s columns of $G_H$. Substituting the formula for $D_S$, DH can be written as Equation 11:

$$D_H = [G_{H1} | G_{H2}] \cdot [D^T | (G_{LDPC} \cdot D)^T]^T. \quad [\text{Eqn. 11}]$$

Equation 11 can be re-arranged to form Equation 12:

$$D_H = (G_{H1} + G_{H2} \cdot G_{LDPC}) \cdot D. \quad [\text{Eqn. 12}]$$

Using Equations 4 and 5, the encoding symbol E 350 can be written as illustrated by Equation 13:

$$E = G_{LT} \cdot F = G_{LT} \cdot [D^T | D_S^T | D_H^T]^T. \quad [\text{Eqn. 13}]$$

Equation 13 also can re-written as Equation 14:

$$E = [G_{LT1} | G_{LT2} | G_{LT3}] \cdot [D^T | (G_{LDPC} \cdot D)^T | ((G_{H1} + G_{H2} \cdot G_{LDPC}) \cdot D)^T]^T. \quad [\text{Eqn. 14}]$$

In Equation 14, $G_{LT1}$, $G_{LT2}$, and $G_{LT3}$ consist of the first k columns, the following s columns, and the last h columns of $G_{ET}$, respectively. Equation 14 further can be re-arranged in the form illustrated by Equation 15:

$$E = (G_{LT1} + G_{LT2} \cdot G_{LDPC} + G_{LT3} \cdot (G_{H1} + G_{H2} \cdot G_{LDPC})) \cdot D. \quad [\text{Eqn. 15}]$$

A new matrix, $G_{R, nonsys}$, is a non-systematic generating matrix. The non-systematic generating matrix is defined by Equation 16:

$$G_{R,nonsys} = G_{LT1} + G_{LT2} \cdot G_{LDPC} + G_{LT3} \cdot (G_{H1} + G_{H2} \cdot G_{LDPC}). \quad [\text{Eqn. 16}]$$

$G_{R, nonsys}$ is referenced as the non-systematic generating matrix because, using Equations 15 and 16 yields Equation 17:

$$G_{R,nonsys} \cdot D = E. \quad [\text{Eqn. 17}]$$

Using Equation 1, Equation 17 can be re-written as Equation 18:

$$G_{R,nonsys} \cdot G_T^{-1} \cdot C = E. \quad [\text{Eqn. 18}]$$

Therefore, the systematic generating matrix is also defined by Equation 19:

$$G_{R,sys} = G_{R,nonsys} \cdot G_T^{-1}. \quad [\text{Eqn. 19}]$$

In the systematic generating matrix, the first k rows are the identity matrix (since it is systematic and assuming that the encoded symbols $e_i$, i=1, 2, . . . , k, are equal to the source symbols). Therefore, $G_T^{-1}$ is the inverse of the first k rows of $G_{R, nonsys}$.

Another new matrix $G_{R1}$ is created from the first k rows of $G_{R, nonsys}$ in Equation 16. An additional new matrix $G_{R2}$ 510 is created from the remaining rows. As such, $G_T^{-1} = G_{R1}^{-1}$. Since $G_T^{-1}$ is already known at the decoder 500, $G_{R1}^{-1}$ 515 also is already known at the decoder 500.

E 350 is denoted by $E_r$ 505 for the set of received encoding symbols with index i>k. $E_r$ 505 is defined by Equation 20:

$$E_r = (G_{R2} \cdot G_{R1}^{-1}) \cdot C. \quad [\text{Eqn. 20}]$$

Further, C 305 is denoted by $C_{erased}$ 520 for the set of erased source symbols and by $C_{received}$ 525 for the set of received source symbols. Then, Equation 20 can be re-written as Equation 21:

$$E_r = (G_{R2} G_{R1}^{-1})_{[erased]} \cdot C_{erased} + (G_{R2} G_{R1}^{-1})_{[received]} \cdot C_{received}. \quad [\text{Eqn. 21}]$$

In Equation 21, $(G_{R2} \ G_{R1}^{-1})_{[erased]}$ 530 and $(G_{R2} \ G_{R1}^{-1})_{[received]}$ 535 are the columns of $G_{R2} \ G_{R1}^{-1}$ with indices equal to the indices of the erased source symbols and the indices of the received symbols, respectively. Finally, the single stage decoder 500 utilizes Equation 22 to recover erased symbols.

$$C_{erased} = (G_{R2} \cdot G_{R1}^{-1})_{[erased]}^{-1} \cdot (E_r + (G_{R2} \cdot G_{R1}^{-1})_{[receieved]} \cdot C_{receieved}). \quad [\text{Eqn. 22}]$$

The single stage decoder 500 uses Equation 22 to recover erased symbols as opposed to the multi-stage decoders that need to invert the generating matrix $A(i_1, i_2, \ldots, i_r)$, regardless of the number of erased source symbols, in order to recover erased symbols. The generating matrix is an L×L matrix. As opposed to the multi-stage decoder, the single stage decoder 500 inverts a erased-recovery matrix $(G_{R2} \ G_{R1}^{-1})_{[erased]}$ 530. The erased-recovery matrix $(G_{R2} \ G_{R1}^{-1})_{[erased]}$ 530 has a dimension equal to the number of erased symbols.

For example, when k=1024 and symbol erasure rate is 1%, the multi-stage decoder needs to invert a 1095×1095 sparse matrix with computational complexity on the order of '15000'. However, the single stage decoder 500 needs to find the inverse of the erased-recovery matrix that is a 10×10 dense matrix with a computational complexity on the order of '1000'.

Further, the precoding matrix $G_{R1}^{-1}$ 515 depends only on the parameter k. As such, there is no need to compute this inverse at the transmission of each source block as long as the same k is used as in the DVB-H and IETF standards. The precoding matrix $G_{R1}^{-1}$ 515 is known at the decoder 500 and can be saved.

Figure 6:
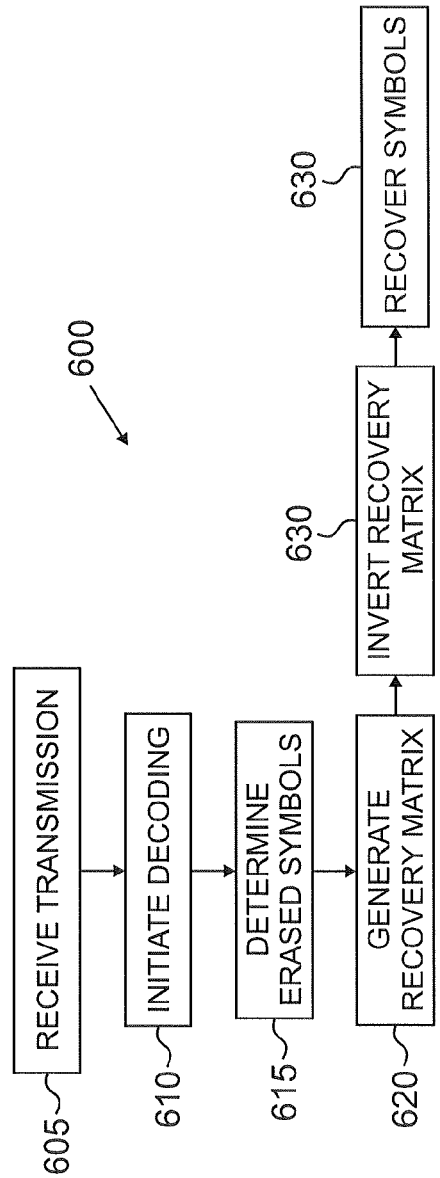
FIG. 6 illustrates a process for recovering symbols in a wireless transmission according to embodiments of the present disclosure.

FIG. 6 illustrates a process for recovering symbols in a wireless transmission according to embodiments of the present disclosure. The embodiment of the process for recovering symbols 600 shown in FIG. 6 is for illustration only. Other embodiments for the process for recovering symbols 600 could be used without departing from the scope of this disclosure.

In step 605, a receiver in a wireless communication device receives a wireless transmission. The wireless communication device can be, but is not limited to, a subscriber station, a base station or a relay station.

A decoding operation is initiated in step 610 if one or more symbols are erased. For example purpose, the receiver described with respect to FIG. 6 includes a decoder 281 that comprises a single stage decoder 500. However, alternative embodiments with raptor encoder/decoders apply equally. The single stage decoder 500 is configured to perform a decoding operation.

In step 615, the decoder 500 determines the erased symbols among the source symbols. For example, the decoder 500 may compute the erasure rate. The symbol erasure rate is defined by the number of erased symbols from the number of source symbols.

In step 620, the decoder 500 generates an erased recovery matrix. The recovery matrix is generated based on the set of erased symbols. The size of the recovery matrix is based on the number of erased symbols such that a small number of erasures causes a small recovery matrix and a large number of erasures causes a large recovery rate. For example, when transmitting 1000 source symbols, a symbol erasure rate of 1% causes the generation of a 10×10 matrix. The erased recovery matrix is generated from a portion of non-systematic matrix and a precoding matrix. The decoder 500 also generates a received recovery matrix based on a portion of the non-systematic matrix and the precoding matrix.

The decoder 500 inverts the erased recovery matrix in step 625. The decoder 500 inverts the erased recovery matrix for use in determining the erased symbols.

In step 630, the decoder 500 recovers erased symbols based on a function of the inverted erased recovery matrix. The decoder 500 executes Equation 22 in order to recover the erased symbols. In Equation 22, the erased recovery matrix is represented by $(G_{R2} \cdot G_{R1}^{-1})_{[erased]}$ 530.

The complexity of the single stage decoder 500 varies with the packet erasure rate. Therefore, in a scenario with low packet eraser rate, which is usually the case in wireless links protected by physical turbo code, the reduction in complexity is vast.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A wireless communications device configured to decode encoded transmissions in a wireless communications network, the wireless communications device comprising:
a single stage decoder comprising a programmable finite state machine configured to execute a plurality of instructions associated with the single stage decoder such that the single stage decoder is configured to recover erased symbols based in part on inverting a recovery matrix, and wherein a size of the recovery matrix is based on a symbol erasure rate.

2. The wireless communications device as set forth in claim 1, wherein the single stage decoder comprises a raptor decoder.

3. The wireless communications device as set forth in claim 1, wherein the recovery matrix comprises a portion of a non-systematic matrix and a portion of a precoding matrix.

4. The wireless communications device as set forth in claim 3, wherein the non-systematic matrix depends on a number of source symbols.

5. The wireless communications device as set forth in claim 1, wherein the single stage decoder is configured to recover the erased symbols based on an equation defined by $$C_{erased} = (G_{R2} \cdot G_{R1}^{-1})_{[erased]}^{-1} \cdot (E_r + (G_{R2} \cdot G_{R1}^{-1})_{[received]} \cdot C_{received}), \text{ and}$$

wherein $(G_{R2} G_{R1}^{-1})$ (erased) denotes the recovery matrix in which $G_{R2}$ comprises a non-systematic matrix and $G_{R1}^{-1}$ comprises a precoding matrix, the erased and received denote columns of $G_{R2}$ and $G_{R1}^{-1}$ with indices equal to the erased symbols and $E_r$ denotes a set of received encoding symbols.

6. The wireless communications device as set forth in claim 1, wherein the receiver is in at least one of a wireless subscriber station, a relay station and a base station.

7. The wireless communications device as set forth in claim 1, wherein the wireless network comprises at least one of an OFDMA, CDMA, IEEE 802.16, DVB-H and IETF network.

8. For use in a wireless communications device, a decoder configured to decode raptor-encoded transmissions in a wireless communications network, the decoder comprising:
a single stage configured to recover erased symbols; and
a processor configured to execute a plurality of instructions associated with the single stage such that the single stage is configured to recover erased symbols based at least in part on inverting a recovery matrix, wherein a size of the recovery matrix is based on a symbol erasure rate.

9. The decoder as set forth in claim 8, wherein the decoder comprises a raptor decoder.

10. The decoder as set forth in claim 8, wherein the recovery matrix comprises a portion of a non-systematic matrix and a portion of a precoding matrix.

11. The receiver as set forth in claim 10, wherein the non-systematic matrix depends on a number of source symbols.

12. The decoder as set forth in claim 8, wherein the single stage decoder is configured to recover the erased symbols based on an equation defined by $$C_{erased} = (G_{R2} \cdot G_{R1}^{-1})_{[erased]}^{-1} \cdot (E_r + (G_{R2} \cdot G_{R1}^{-1})_{[received]} \cdot C_{received}), \text{ and}$$

wherein $(G_{R2} G_{R1}^{-1})$ (erased) denotes the recovery matrix in which $G_{R2}$ comprises a non-systematic matrix and $G_{R1}^{-1}$ comprises a precoding matrix, the erased and received denote columns of $G_{R2}$ and $G_{R1}^{-1}$ with indices equal to the erased symbols and $E_r$ denotes a set of received encoding symbols.

13. The decoder as set forth in claim 8, wherein the decoder comprises at least one of a wireless subscriber station, a relay station and a base station.

14. The receiver as set forth in claim 8, wherein the wireless communications network comprises at least one of an OFDMA, CDMA, IEEE 802.16, DVB-H and IETF network.

15. A method for recovering erased symbols in a transmission in a wireless communications network, the method comprising:
receiving a data transmission;
performing a decoding operation on the received data transmission with a single stage decoder;
determining a symbol erasure rate of the received data transmission, the symbol erasure rate defined by a number of erased symbols;
generating a recovery matrix based on the symbol erasure rate;
inverting the recovery matrix; and
recovering erased symbols of the received data transmission based on a function of the inverted recovery matrix.

16. The method as set forth in claim 15, wherein the recovery matrix comprises a portion of a non-systematic matrix and a portion of a precoding matrix.

17. The method as set forth in claim 16, wherein the non-systematic matrix depends on a number of source symbols.

18. The method as set forth in claim 16, wherein recovering comprises using an equation defined by $$C_{erased} = (G_{R2} \cdot G_{R1}^{-1})_{[erased]}^{-1} \cdot (E_r + (G_{R2} \cdot G_{R1}^{-1})_{[received]} \cdot C_{received}),$$

wherein $(G_{R2} G_{R1}^{-1})$ (erased) denotes the recovery matrix in which $G_{R2}$ comprises a non-systematic matrix and $G_{R1}^{-1}$ comprises a precoding matrix, the erased and received denote columns of $G_{R2}$ and $G_{R1}^{-1}$ with indices equal to the erased symbols and $E_r$ denotes a set of received encoding symbols.

19. The method as set forth in claim 15, wherein the decoder comprises at least one of a wireless mobile station, a relay station and a base station.

20. The method as set forth in claim 15, wherein the wireless communications network comprises at least one of an OFDMA, CDMA, IEEE 802.16, DVB-H and IETF network.

* * * * *